United States Patent [19]

Pace

[11] 4,345,217

[45] Aug. 17, 1982

[54] CASCODE CURRENT SOURCE

[75] Inventor: W. David Pace, Tempe, Ariz.

[73] Assignee: Motorola, Inc., Schaumburg, Ill.

[21] Appl. No.: 175,548

[22] Filed: Aug. 5, 1980

[51] Int. Cl.[3] .............................................. H03F 3/04

[52] U.S. Cl. .................................... 330/288; 330/311

[58] Field of Search ....................... 330/257, 288, 311; 323/315, 316; 307/297

[56] References Cited

U.S. PATENT DOCUMENTS 4,237,414 12/1980 Stein .............................. 330/288 X

FOREIGN PATENT DOCUMENTS 543137 12/1977 U.S.S.R. .............................. 330/288

*Primary Examiner*—James B. Mullins

*Attorney, Agent, or Firm*—Michael D. Bingham

[57] ABSTRACT

A cascode circuit arrangement comprising an input current mirror circuit for providing an output current substantially equal to a supplied input current and an output circuit coupled in cascode to the output of the input current mirror and the output of the circuit. The output circuit comprises a pair of NPN transistors connected in a Darlington amplifier configuration which is supplied a constant bias potential as the input of the amplifier. The Darlington amplifier is coupled in cascode between the output of the current mirror and the output of the current source to buffer the same from variations in the output voltage supplied at the output. The output circuit includes a PNP lateral transistor the emitter of which is coupled between the interconnected emitter and base of said pair of transistors, the base is coupled to the bias potential and the collector to the output of the current mirror such that the reverse base current of the cascoded one of said pair of transistors is returned to the output of the current mirror to eliminate reverse base current error when the $BV_{CEO}$ of the cascoded transistor is exceeded.

3 Claims, 4 Drawing Figures

CASCODE CURRENT SOURCE

FIELD OF THE INVENTION

This invention relates to current producing circuits and more particularly to a cascode current circuit for high voltage, high accuracy applications.

BACKGROUND OF THE PRIOR ART

Current producing circuits such as current mirror circuits find wide applications in integrated circuit uses. A well known current mirror circuit, as shown in FIG. 1, utilized in contemporary monolithic circuits comprises a diode coupled in parallel to the base-emitter path of an output transistor. Typically the diode is fabricated as a transistor with the base connected to the collector as understood with the base-emitter area being perfectly matched to the base-emitter area of the output transistor such that the output current ($I_{out}$) appearing at the collector of the output transistor is substantially equal to the input current ($I_{in}$) supplied to the diode. Generally, using standard monolithic processing techniques, $I_{out}$ can be closely matched to $I_{in}$. However, the matching between $I_{out}$ and $I_{in}$ is seriously degraded with variations in the output voltage supplied to the output matched transistor. Thus, in some applications requiring very tight matching tolerance, for instance, 1 percent or less between $I_{in}$ and $I_{out}$ with variations in the output voltage, the foregoing described current mirror circuit becomes inadequate.

Additionally, there are some applications which require precision NPN current mirrors of the type described above having a 1% matching tolerance specification between the input and output currents and which the output voltage may exceed the $BV_{CEO}$ voltage of the NPN transistors fabricated with contemporary monolithic processes. For example, some Subscriber Loop Interface Circuits (SLICs) that provide conversion between a balanced bidirectional transmission path and a pair of unidirectional transmission paths as known in the art require current mirror circuits having the aforementioned precision requirement which must withstand voltages up to 60 volts. However, most present day integrated circuit process techniques result in a $BV_{CEO}$ of the NPN transistors equal to approximately 45 volts; which is considerably less than the transistors may be subjected to in the foregoing environment.

Thus, there is a need for a current sourcing circuit suitable for utilization in high voltage and high accuracy applications.

SUMMARY OF THE INVENTION

Accordingly, it is an object of the present invention to provide a cascode circuit for providing an output current for high voltage, high accuracy applications.

In accordance with the foregoing and other objects there is provided a cascode current producing circuit comprising an input circuit portion that is adapted to receive an input current for producing an output current and an output circuit portion including a pair of transistors connected in a Darlington configuration which are coupled between the output of the input circuit portion and an output terminal of the cascode circuit for buffering the input circuit portion from variations in output voltages appearing at the output terminal, a third transistor is provided of opposite conductivity type than the pair of transistors with the base-to-emitter path thereof being coupled between the interconnected emitter and base of the respective pair of transistors to the collector of the first one of the two pair of transistors, the collector of said third transistor is connected to the emitter of the second one of the two transistors to the output of the input circuit portion.

DETAILED DISCUSSION OF THE PREFERRED EMBODIMENT

Figure 1:
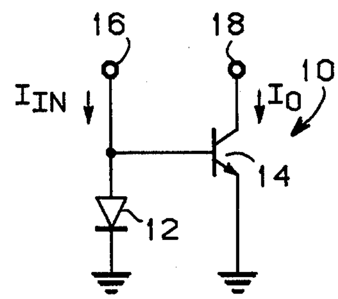
FIG. 1 is a schematic diagram of a current mirror circuit generally known in the art.

FIG. 1 illustrates current mirror circuit 10 which is well known in the art and is shown as comprising diode 12 connected in parallel to the base-emitter of transistor 14. Terminal 16 is generally coupled to an input load, for instance, a resistor coupled to a voltage potential which provides a current $I_{in}$ supplied to the interconnection between the anode of diode 12 and the base of transistor 14. As understood, diode 12 may be realized by a transistor having the base connected to the collector thereof such that with the base-emitter areas of the two devices being perfectly matched the output current produced at output node 18, $I_0$, is substantially equal to the input current $I_{in}$. Generally, with present-day monolithic processes the match between the output current at node 18 to the input current at node 16 can be maintained within 3–5% of one another. However, serious degradation in a match between the two currents occurs if the voltage at output terminal 18 should vary (it being understood that node 18 would be coupled to a source of potential).

Figure 2:
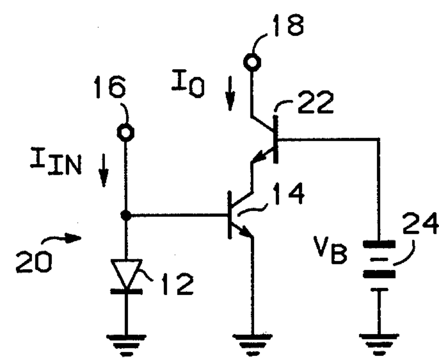
FIG. 2 is a schematic diagram illustrating a cascode circuit utilizing the current mirror circuit of FIG. 1.

Turning to the remaining figures, there is described the preferred embodiment of the present invention wherein components of like components to FIG. 1 are referenced by the same reference numerals. In particular, FIG. 2 shows a cascode current circuit 20 including an input portion comprising the current mirror circuit described above with respect to FIG. 1 and an output cascode portion comprising single NPN transistor 22. Transistor 22 which has its collector-to-emitter path connected in cascode with the transistor 14 provides buffering therebetween with the output voltage which would be supplied at node 18 with the base of transistor 22 being coupled to a substantially constant bias potential 24 that provides a potential $V_B$. Any variations in the output voltage at node 18 are not transferred to transistor 14 since the collector voltage thereof is kept constant wherein the output current match with respect to the input current is maintained with variations in the output voltage at terminal 18. A problem with the cascode arrangement of FIG. 2 results because of the base current error produced by transistor 22. For example, with the beta of transistor 22 being equal to 50, the base current comprises approximately 2% of the output current $I_0$. This prevents a very precision current circuit from being established.

Figure 3:
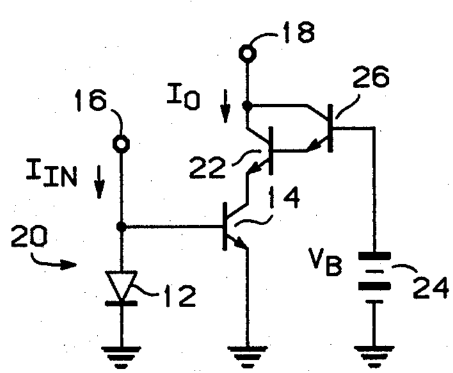
FIG. 3 is a schematic diagram illustrating a Darlington configured cascode circuit in combination with the current mirror circuit of FIG. 1.

Turning to FIG. 3, the cascode current source 20 can be modified to include a cascode output portion comprising a second or driving transistor 26 connected with cascoded transistor 22 to form a Darlington amplifier arrangement. This cascode arrangement maintains the mirror accuracy by buffering the matched transistors 12 and 14 from output voltage swings occurring at node 18 in the manner discussed above while introducing less than 0.1% base current error because of the much higher beta factor of the Darlington arrangement over the single cascoded structure. Hence, the NPN Darlington arrangement of transistors 22 and 26 reduces base current errors that otherwise plague the single NPN cascode arrangement of FIG. 2.

A problem with the cascode circuit arrangement of FIGS. 2 and 3 is that using contemporary integrated circuit processing techniques the collector-emitter breakdown voltage, $BV_{CEO}$ of the NPN devices is approximately 45 volts. However, in some applications it has been found that the voltage appearing at node 18 may be greater than 60 volts and may change from 10 to 60 volts which is beyond the 40–45 volt breakdown capabilities of the NPN transistors.

Figure 4:
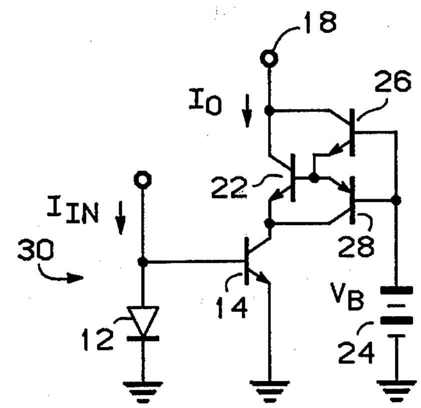
FIG. 4 is a schematic diagram illustrating the preferred embodiment of the present invention.

Turning now to FIG. 4 there is shown cascode current circuit 30 of the preferred embodiment that is suitable for manufacture in integrated circuit form wherein the matching between current $I_{in}$ to the current $I_0$ is maintained within a 1% tolerance with substantial voltage changes accuring at node 18 and which has all of the advantages of the circuit of FIG. 3 while reducing any reverse current errors that may occur due to transistor 22 being operated above the $BV_{CEO}$ voltage thereof. As illustrated, cascode current circuit 30 comprises a PNP lateral transistor 28 coupled to the Darlington connected transistors 22 and 26 of the cascode output portion of the circuit. The emitter of transistor 28 is connected to the interconnected base and emitter electrodes of transistors 22 and 26 respectively with the base coupled with the base of transistor 26 to bias potential 24. The collector of PNP transistor 28 is returned to the collector of the matched transistor 14.

In operation, PNP transistor 28 is rendered conductive as the collector-emitter breakdown voltage of transistor 22 is exceeded and reverse base current begins to flow out of the base thereof to clamp the voltage at the base of transistor 22 even though the voltage at node 18 increases beyond the $BV_{CEO}$ of the device. The reverse base current error is severely limited since this current is returned through the collector of transistor 28 to matched transistor 14. Hence, the output circuit portion including the Darlington NPN transistors 22 and 26 and PNP transistor 28 maintains a high output impedance at terminal 18 for output voltages greater than the $BV_{CEO}$ characteristics of the NPN devices. Thus the current source of FIG. 4 severely eliminates variations in the output current $I_0$ and protects driver transistor 26 when the $BV_{CEO}$ of the NPN transistors is exceeded.

Test on cascode current circuits fabricated utilizing the teachings of the present invention indicate less than a 1% change in the output current $I_0$ with output voltage variations from 10 volts to 80 volts at terminal 18 with typical NPN transistors having a 45 volt $BV_{CEO}$ characteristic.

I claim:

1. Cascode current source, comprising:

input circuit means receiving an input current supplied at an input for providing an output current at an output which is substantially equal in value to said input current; and cascode circuit means coupled between said output of said input circuit means and an output of the cascode current source for buffering said input circuit means from variations in the voltage appearing at the output of the cascode circuit means including a pair of transistors connected in a Darlington configuration and a third transistor of complementary conductivity type as said pair of transistors with the base thereof connected with the base of the first transistor of said pair of transistors to a node at which is supplied a reference potential, the emitter being connected to the interconnected emitter of said first transistor and base of the second transistor and said collector being coupled with the emitter of said second transistor to said output of said input circuit means, the collectors of said first and second transistors being coupled to said output of the cascode current means.

2. Cascode current mirror, comprising:

input current mirror circuit means including a pair of matched semiconductor devices for providing an output current at an output thereof substantially equal to an input current supplied at an input thereof:

a first transistor of a first conductivity type having the collector-emitter path thereof coupled in series to said output of the cascode current source;

a second transistor of said first conductivity type the base thereof being adapted to receive a bias potential, the emitter being coupled to the base of said first transistor and the collector being coupled to the collector of said first transistor; and a third transistor of complementary conductivity type as said first transistor the base of which is coupled to said base of said second transistor, the emitter being coupled to said base of said first transistor and the collector being coupled to said emitter of said first transistor.

3. A cascode current circuit, comprising:

an input transistor for producing output current at the collector thereof in response to an input current being provided to the base thereof, the emitter thereof being coupled to a terminal at which is supplied a first reference potential;

a cascode transistor the collector-emitter path being coupled between said collector of said input transistor and an output terminal;

a driver transistor having a base thereof coupled to a node adapted to receive a second reference potential, an emitter coupled to the base of said cascode transistor, and a collector coupled to the collector of said cascode transistors; and a transistor of complementary conductivity type as said cascode and driver transistors having a base coupled to said base of said driver transistor an emitter coupled to said base of said cascode transistor and a collector coupled to said emitter of said cascode transistor.

* * * * *